US011413695B2

(12) United States Patent
Kurapov

(10) Patent No.: US 11,413,695 B2
(45) Date of Patent: Aug. 16, 2022

(54) TAP DRILL WITH ENHANCED PERFORMANCE

(71) Applicant: Oerlikon Surface Solutions AG, Pfäffikon, Pfäffikon (CH)

(72) Inventor: Denis Kurapov, Walenstadt (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 220 days.

(21) Appl. No.: 16/636,601

(22) PCT Filed: Aug. 6, 2018

(86) PCT No.: PCT/EP2018/071255
§ 371 (c)(1),
(2) Date: Feb. 4, 2020

(87) PCT Pub. No.: WO2019/025629
PCT Pub. Date: Feb. 7, 2019

(65) Prior Publication Data
US 2021/0362258 A1    Nov. 25, 2021

Related U.S. Application Data
(60) Provisional application No. 62/541,195, filed on Aug. 4, 2017.

(51) Int. Cl.
| | |
|---|---|
| *B23G 5/06* | (2006.01) |
| *C23C 14/06* | (2006.01) |
| *C23C 14/34* | (2006.01) |
| *C23C 14/35* | (2006.01) |
| *C23C 28/04* | (2006.01) |

(52) U.S. Cl.
CPC ............ *B23G 5/06* (2013.01); *C23C 14/0635* (2013.01); *C23C 14/0641* (2013.01); *C23C 14/3414* (2013.01); *C23C 14/35* (2013.01); *C23C 28/042* (2013.01); *C23C 28/044* (2013.01); *B23B 2228/36* (2013.01); *B23G 2200/26* (2013.01); *B23G 2225/52* (2013.01)

(58) Field of Classification Search
CPC ... B23G 5/06; C23C 14/0635; C23C 14/0641; C23C 14/35; C23C 28/044; B23B 2228/08; B23B 2228/10; B23B 2228/36
USPC ......................................... 428/697, 698, 699
See application file for complete search history.

(56) References Cited

U.S. PATENT DOCUMENTS

| | | |
|---|---|---|
| 7,348,074 B2 | 3/2008 | Derflinger |
| 9,540,726 B2 | 1/2017 | Krassnitzer |
| 2005/0003239 A1 | 1/2005 | Derflinger et al. |

(Continued)

FOREIGN PATENT DOCUMENTS

EP    1726390 A1    11/2006

*Primary Examiner* — Archene A Turner

(57) ABSTRACT

The present invention relates to a tap drill comprising a substrate and a coating, wherein the coating is deposited on at least a portion of the substrate comprising the head of the drill, the coating comprising a first layer deposited directly on the substrate and a second layer deposited atop the first layer, wherein the first layer is a wear resistant layer of (Al, Cr)N deposited by Hi PIMS and the second layer is a friction reduction layer, wherein the second layer is a metal carbide layer or a metal-carbide comprising layer deposited by using a physical vapor deposition (PVD) process of the type magnetron sputtering, preferably of the type HiPIMS.

6 Claims, 2 Drawing Sheets

- Benchmark TiN
- AlCrN and AlCrN+TiN – Arc deposited + post-treatment
- AlCrN+WC/C V1 - Arc deposited
- AlCrN+WC/C V2 - HiPIMS deposited

(56) References Cited

U.S. PATENT DOCUMENTS

| | | | |
|---|---|---|---|
| 2008/0253850 A1* | 10/2008 | Moriguchi | C23C 30/005 407/119 |
| 2010/0129644 A1* | 5/2010 | Endrino | C23C 28/345 428/336 |
| 2011/0117342 A1* | 5/2011 | Sugita | C23C 30/005 428/213 |
| 2014/0248100 A1 | 9/2014 | Krassnitzer | |
| 2016/0068449 A1 | 3/2016 | Tsukihara et al. | |
| 2018/0223436 A1* | 8/2018 | Schier | C23C 28/048 |

\* cited by examiner

TAP DRILL WITH ENHANCED PERFORMANCE

The present invention relates to a tap drill with enhanced performance, comprising a wear resistance layer of Al—Cr—N and a friction reduction layer deposited atop the wear resistance layer and to a method for producing a tap drill.

STATE OF THE ART

In the document U.S. Pat. No. 9,540,726 B2 it is proposed to improve performance of drills, in particular of tap drills and micro drills by coating at least the head of the drill. The coating comprises at least one HiPIMS coating that is applied directly onto the drill substrate and which includes at least one layer of at least one nitride and/or carbide and/or oxide, and an amorphous carbon or DLC layer provided on the HiPIMS layer. The HiPIMS coating can be a (Al, Cr)N layer and the DLC layer can be a metalliferous DLC layer. The drill shown in U.S. Pat. No. 9,540,726 B2 can be used in drilling operations of stainless steel workpieces, however the tool life is relatively short.

OBJECTIVE OF THE PRESENT INVENTION

The objective of the present invention is to provide a coated tap drill and a method for producing a tap drill that may exhibit better performance and relative tool life in drilling operations of stainless steel workpieces in comparison with the state of the art. In particular, better performance in relation to friction reduction and cold-welding reduction properties.

DESCRIPTION OF THE PRESENT INVENTION

The objective of the present invention is attained by providing a tap drill comprising a substrate and a coating, wherein the coating is deposited on at least a portion of the substrate comprising the head of the drill, the coating comprising a first layer deposited directly on the substrate and a second layer deposited atop the first layer, wherein the first layer is a wear resistant layer of (Al, Cr)N deposited by HiPIMS and the second layer is a friction reduction layer, characterized in that:

The second layer is a metal carbide layer or a metal-carbide comprising layer deposited by using a physical vapor deposition (PVD) process of the type magnetron sputtering, preferably of the type high-power impulse magnetron sputtering (HiPIMS) method.

HiPIMS methods are also known as HPPMS methods because of the terminology high power pulsed magnetron sputtering.

Coatings produced by sputtering, in particular by HiPIMS show much better performance compared to coatings produced by arc, in particular if arc-deposited coating is without post-treatment.

HiPIMS provides the possibility to produce dense and smooth coatings. Coating like the AlCrN+WC/C coating shown in FIG. 1 can be produced in one deposition run.

Preferably the friction reduction layer being preferably of carbon-containing titanium nitride or titan carbonitride or diamond like carbon doped with tungsten carbide or a tungsten carbide layer.

According to a preferred embodiment of the present invention the metal carbide layer can be a tungsten carbide layer or comprises mostly (more than 50 atomic-%) tungsten carbide, preferably comprises more than 70 atomic-% tungsten carbide, more preferably more than 90 atomic-%.

According to a further preferred embodiment of the present invention the metal carbide layer can be a titanium carbide layer or comprises mostly (more than 50 atomic-%) titanium carbide, preferably comprises more than 70 atomic-% titanium carbide, more preferably more than 90 atomic-%.

Preferably the second layer is a tungsten carbide comprising layer of the type WC/C.

The objective of the present invention is attained by providing a method for producing a tap drill according to claim 6.

Preferably the second layer is a tungsten carbide comprising layer of the type WC/C and is deposited by sputtering of WC targets in an atmosphere comprising argon and a carbon-containing gas, preferably acetylene gas.

Preferably HiPIMS techniques are used for sputtering of the WC targets.

Preferably the second layer is a titanium carbide comprising layer and is deposited by sputtering of Ti or TiC targets in an atmosphere comprising argon and a carbon-containing gas, preferably acetylene gas.

Preferably HiPIMS techniques are used for sputtering of the Ti of TiC targets.

Figure 1:
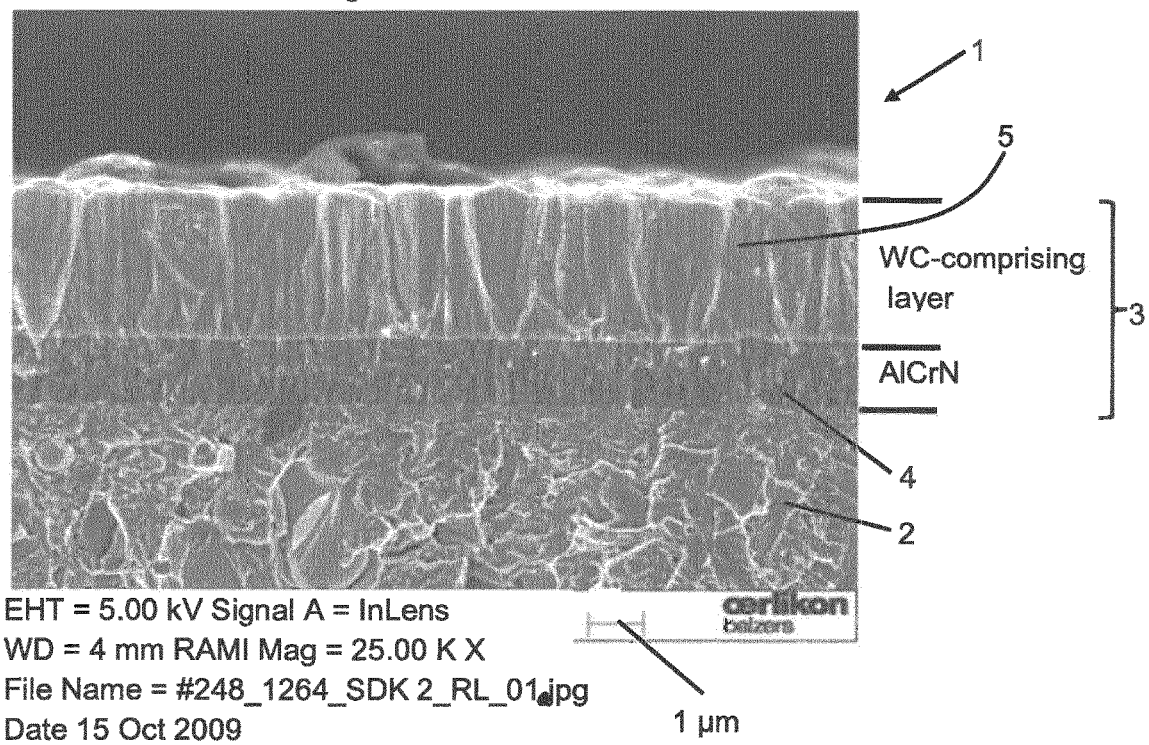
FIG. 1 shows a coating for tap drill according to the present invention.
Figure 1:
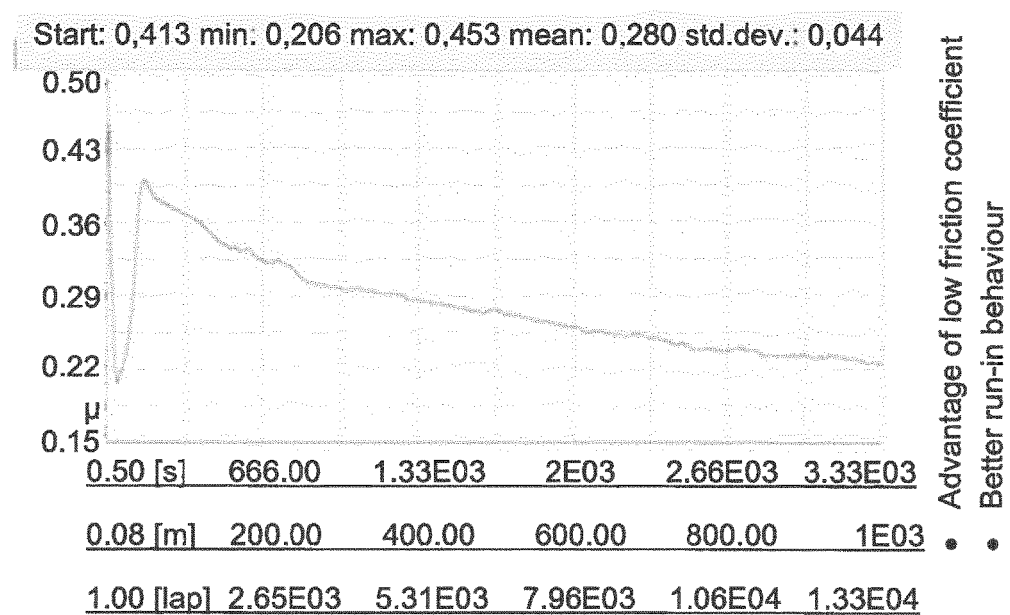

FIG. 1 shows in the upper part a picture of a tap drill 1 according to the present invention. The tap drill 1 comprises a substrate 2 and a coating 3. The coating 3 is deposited on at least a portion of the substrate 2 comprising the head of the drill 1.

The coating 3 comprises a first layer 4. The first layer 4 is deposited directly on the substrate 2. The coating 3 comprises a second layer 5. The second layer 5 is deposited atop the first layer 4.

The first layer 4 is a wear resistant layer of (Al, Cr)N. The first layer 4 is deposited by HiPIMS. The second layer 5 is a friction reducing layer. The second layer 5 is a metal carbide layer or a metal-carbide comprising layer. It can also be preferably of carbon-containing titanium nitride or titan carbonitride or diamond like carbon doped with tungsten or a tungsten carbide layer. The second layer 5 is deposited using physical a vapor deposition (PVD) process, preferably of the type magnetron sputtering, preferably of the type HiPIMS.

Figure 2:
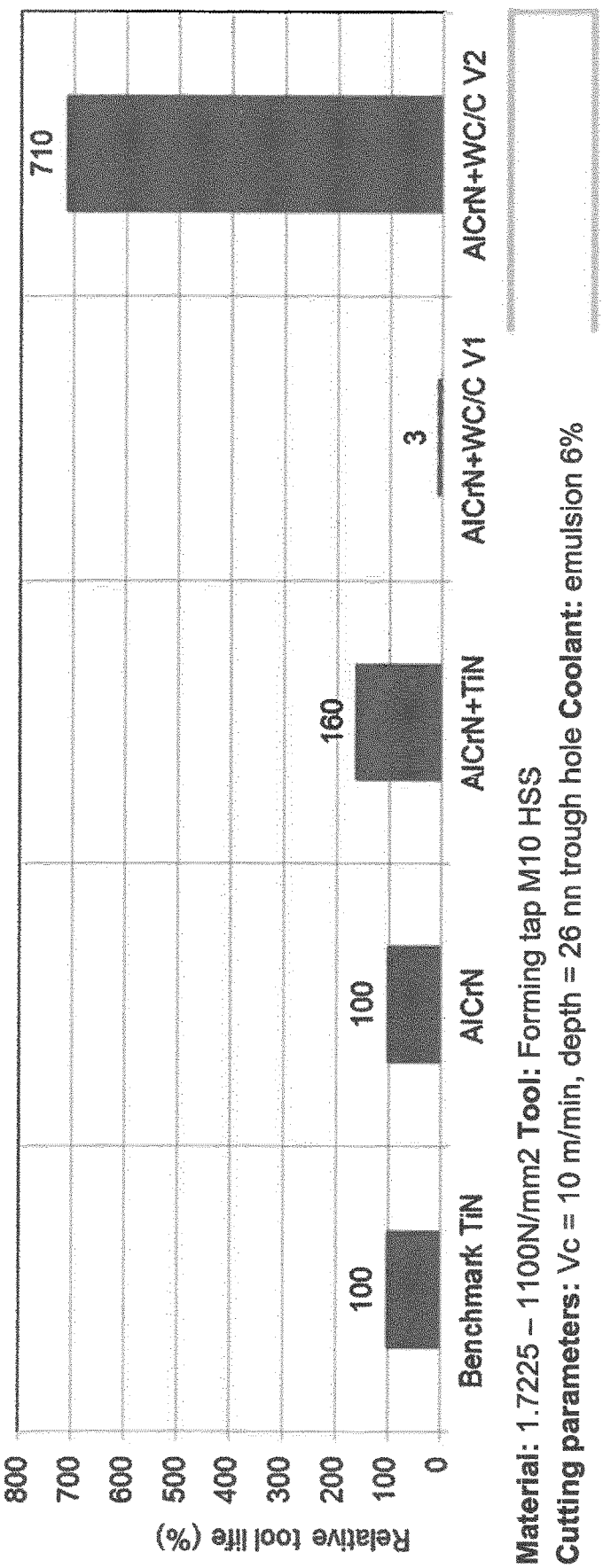
FIG. 2 shows the benefits of the present invention in comparison with the state of the art.

This can be seen in FIG. 2, which shows n a diagram the relative tool life of different coatings and/or depositing methods. The tool life of the Benchmark tool is defined to 100%. In FIG. 2 the Benchmark tool has been deposited with TiN. An AlCrN coating shows the same tool life of 100% compared to the Benchmark. An AlCrN+TiN coating, which has been deposited by Arc deposition and post-treated in order to reduce roughness shows a tool life of 160% compared to the Benchmark. A significant tool life increase can be seen. An AlCrN+WC/C coating that has been deposited by Arc deposition shows a tool life of 3% compared to the Benchmark. An AlCrN+WC/C coating deposited by HiPIMS deposition shows a tool life of 710% compared to the Benchmark.

AlCrN+TiN coating (deposited by arc plus post-treatment in order to reduce roughness) show significant tool life increase vs. Benchmark.

Smooth coating surface has advantage.

Coatings produced by sputtering, in particular by HiPIMS show much better performance compared to coatings produced by arc, in particular if arc-deposited coating is without post-treatment.

HiPIMS provides the possibility to produce dense and smooth coatings. Coating like the AlCrN+WC/C coating shown in FIG. 1 can be produced in one deposition run.

AlCrN+Ti(CN) coating shows increase in the tool life. This is actually the main topic for application.

Preferably the first layer 4 is deposited by sputtering of Cr targets in a nitrogen reactive atmosphere (comprising argon and nitrogen or only nitrogen) by using HiPIMS techniques.

According to a preferred embodiment of the present invention, the second layer 5 is a tungsten carbide comprising layer of the type WC/C (WC+C) which can deposited by sputtering of WC targets in an atmosphere comprising argon and a carbon-containing gas, preferably acetylene gas (i.e. preferably in an atmosphere comprising argon and acetylene gas). According to a variant of this preferred embodiment instead of conventional sputtering techniques HiPIMS techniques are used for sputtering of the WC targets.

According to a further preferred embodiment of the present invention, the second layer 5 is a titanium carbide comprising layer which can be deposited by sputtering of Ti or TiC targets in an atmosphere comprising argon and a carbon-containing gas, preferably acetylene gas (i.e. preferably in an atmosphere comprising argon and acetylene gas). According to a variant of this preferred embodiment instead of conventional sputtering techniques HiPIMS techniques are used for sputtering of the Ti or TiC targets.

The invention claimed is:

1. A tap drill comprising:
a substrate and a coating, wherein the coating is deposited on at least a portion of the substrate comprising a head of the drill, the coating comprising a first layer deposited directly on the substrate and a second layer deposited atop the first layer, wherein the first layer is a wear resistant layer of (Al, Cr)N deposited by HiPIMS and the second layer is a friction reduction layer, wherein the second layer is a metal carbide layer deposited by using a physical vapor deposition (PVD) process of the type magnetron sputtering.

2. The tap drill according to claim 1, wherein the second layer is deposited by using HiPIMS.

3. The tap drill according to claim 1, wherein the metal carbide layer is a titanium carbide layer or a tungsten carbide layer.

4. A method for producing a tap drill comprising a substrate and a coating, the method comprising:
depositing the coating on at least a portion of the substrate comprising a head of the drill, the coating comprising a first layer and a second layer;
using a HiPIMS process to deposit the first layer directly on the substrate; and
depositing the second layer atop the first layer;
wherein the first layer is a wear resistant layer of (AlCr)N, and
wherein the second layer is a friction reduction layer, and the second layer is a metal carbide layer.

5. The method for producing a tap drill according to claim 4, wherein the second layer is a titanium carbide layer and is deposited by sputtering of Ti or TiC targets in an atmosphere comprising argon and a carbon-containing gas.

6. The method for producing a tap drill according to claim 5, comprising using HiPIMS techniques for sputtering of the Ti or TiC targets.

* * * * *